United States Patent [19]

Lordi

[11] Patent Number: 5,611,042
[45] Date of Patent: Mar. 11, 1997

[54] DATA ERROR DETECTION AND CORRECTION FOR A SHARED SRAM

[76] Inventor: Angela L. Lordi, 2043 Fort Bevon Rd., Harleysville, Pa. 19438

[21] Appl. No.: 541,989

[22] Filed: Oct. 10, 1995

[51] Int. Cl.$^6$ ............................ G01R 31/28; G11C 29/00; G06F 11/00
[52] U.S. Cl. ........................ 395/182.04; 371/10.2
[58] Field of Search ................... 395/182.04, 182.05; 371/10.2

[56] References Cited

U.S. PATENT DOCUMENTS

| | | | |
|---|---|---|---|
| 3,668,644 | 6/1972 | Looschen | 395/182.04 |
| 3,761,903 | 9/1973 | Bird, Jr. | 371/10.2 X |
| 4,404,647 | 9/1983 | Jones | 395/182.04 |
| 5,251,174 | 10/1993 | Hwang | 371/10.2 X |
| 5,402,377 | 3/1995 | Ohhata | 371/10.2 X |

*Primary Examiner*—Robert W. Beausoliel, Jr.
*Assistant Examiner*—Glenn Snyder
*Attorney, Agent, or Firm*—Arthur A. Sapelli

[57] ABSTRACT

An apparatus for correcting errors in information read from a memory unit, comprises a first and second memory, where primary and backup information are stored in predetermined addressable locations. The primary information and the backup information in corresponding locations are the same. A processor, commands a read of information stored in the memory unit, the read being a simultaneous read of the primary information and the corresponding backup information. A multiplexer, couples the output ports to the processor. The primary information read from the first and second memory and the backup information read from the first and second memory are coupled to the multiplexer. The first and second memory each indicate via a respective first and second error signal if an error is detected on the information just read from the first and second memory, respectively. Select logic determines whether the data in the first and second memory contains the primary or the backup information and generates the control signal to select the set of input ports to be the output of the multiplexer. The control signal selects the primary signal to be coupled to the processor if no error is indicated in the primary copy and selects the backup information to be coupled to the processor if an error is indicated in the primary copy and not the backup copy.

5 Claims, 7 Drawing Sheets

PARITY SELECT LOGIC

| $P_2$ | $P_1$ | S |
|---|---|---|
| 0 | 0 | 1 |
| 0 | 1 | 1 |
| 1 | 0 | 2 |
| 1 | 1 | — |

(0=NO PARITY ERROR)

SELECT

GENERATE INTERRUPT TO 80C31

| SRAM SELECT LOGIC | | SRAM1 | | SRAM2 | | | |
|---|---|---|---|---|---|---|---|
| | | A17 | A16 | A17 | A16 | R1 | R2 |
| 80C31 IS ACCESSING SRAM BYTE (P1) | | 1 | 0 | 0 | 0 | 1 | 1 |
| 80C31 IS ACCESSING SRAM BYTE (P2) | | 0 | 0 | 1 | 0 | 1 | 1 |
| 68XXX ACCESSING SRAM (FOR PRIMARY ONLY) | BYTE (P1) | ∅ | ∅ | 0 | 0 | 0 | 1 |
| | WORD (P1,P2) | 0 | 0 | 0 | 0 | 1 | 1 |
| | LONG WORD | 0 | 0 | 0 | 0 | 1 | 1 |
| 68XXX ACCESSING SRAM (FOR BACKUP) | BYTE (B1) | 1 | 0 | ∅ | ∅ | 1 | 0 |
| | WORD (B1,B2) | 1 | 0 | 1 | 0 | 1 | 1 |
| | LONG WORD | 1 | 0 | 1 | 0 | 1 | 1 |

∅ = DON'T CARE

IF R1=1, SRAM1 IS SELECTED
IF R2=1, SRAM2 IS SELECTED

Figure 7

DATA ERROR DETECTION AND CORRECTION FOR A SHARED SRAM

BACKGROUND OF THE INVENTION

The present invention relates to error detection, and more particularly, to error detection and recovery from soft failures of data read from a memory shared by two processors.

Traditionally, error detection and correction (EDAC) techniques of data read from a memory, require the storage into a memory unit of an additional number of bits which is a function of the number of bits composing the information and the resolution capacity of these additional bits (i.e., commonly known as syndrome bits). Each time information (word/byte) is written into memory, the corresponding syndrome bits must be generated. When information is read from memory (in parallel with the corresponding syndrome bits) and an error is detected, the error can generally be corrected, i.e., if the nature of the error is within the resolution capacity of the syndrome bits. This method requires a considerable amount of additional hardware and requires extra time to perform the correction. When the extra time is not available to a processor accessing the memory, a new scheme must be utilized to perform the correction i.e., recovery scheme.

Thus, there is provided by the present invention an approach to error detection and correction which essentially does not require any extra time.

SUMMARY OF THE INVENTION

Thus, there is provided by the present invention, a scheme for error detection and correction which does not require any extra time to perform the correction. An apparatus for correcting errors in information read from a memory unit, comprises a first and second memory, where primary and backup information are stored in predetermined addressable locations. The primary information and the backup information in corresponding locations are the same. A processor, operatively connected to the first and second memory, commands a read of information stored in the memory unit, the read being a simultaneous read of the primary information and the corresponding backup information. A multiplexer has a first set and a second set of input ports and further has a first set of output ports, the first set of output ports being coupled to the processor. The primary information and the backup information are coupled to the two sets of input ports of the multiplexer. Select logic is operatively connected to the multiplexer, and further is operatively connected to the first memory and to the second memory. The first and second memory each equipped with parity detection logics indicate via a respective first and second error signal if an error is detected on the information just read from the first and second memory, respectively. The select logic determines whether the data in the first and second memory contains the primary or the backup information and generates the control signal to select the set of input ports to be output of the multiplexer. The control signal selects the primary information to be coupled to the processor if no error is indicated by in the primary copy and selects the backup information to be coupled to the processor if an error is indicated in the primary copy and not the backup copy.

Accordingly, it is an object of the present invention to provide an apparatus wherein error correction is performed without requiring any additional time.

It is another object of the present invention to provide an apparatus wherein error correction on information read from a static random access memory is performed when an error is detected without requiring any additional time.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 7 shows a truth table of the logic of select logic for the SRAMs.

DETAILED DESCRIPTION

Figure 1:
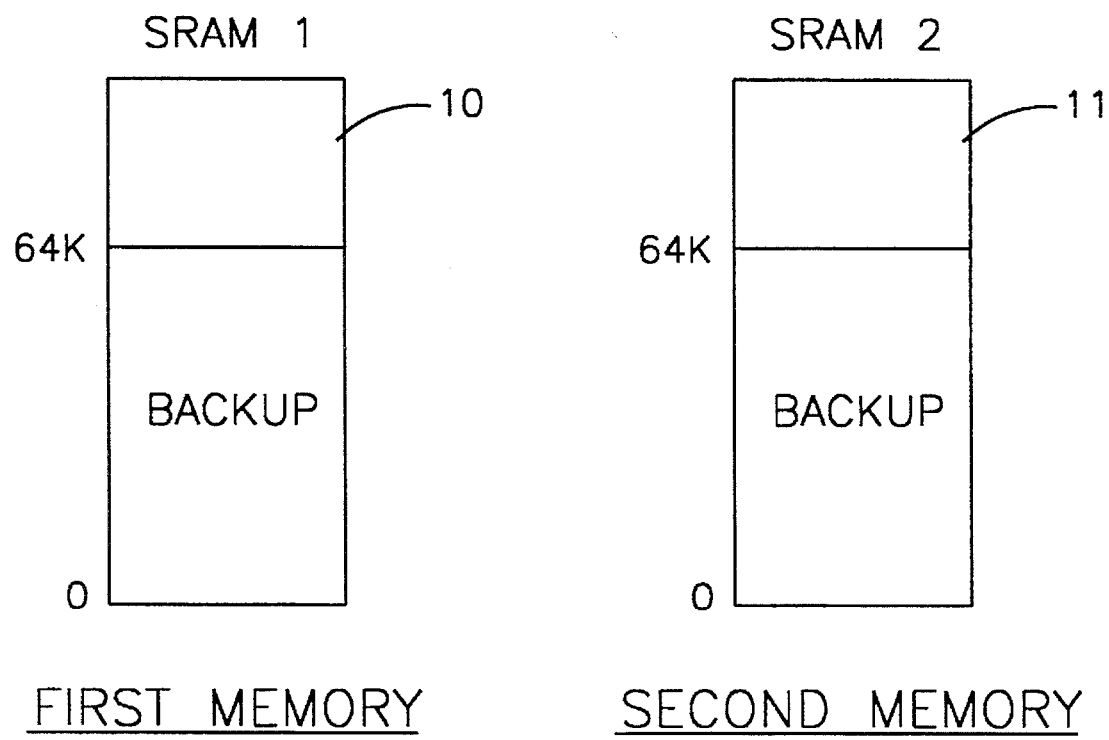
FIG. 1 shows a memory map of a static random access memory (SRAM)

Referring to FIG. 1, there is shown a memory map of a first static random access memory (SRAM 1) 10 and a second static random access memory (SRAM 2) 11 which are accessed by a processor. In the preferred embodiment, a microcontroller, (an Intel 80c31) is to access the SRAM 10, 11. The SRAM 2 11 contains the primary information and SRAM 1 10 contains the backup information.

Figure 2:
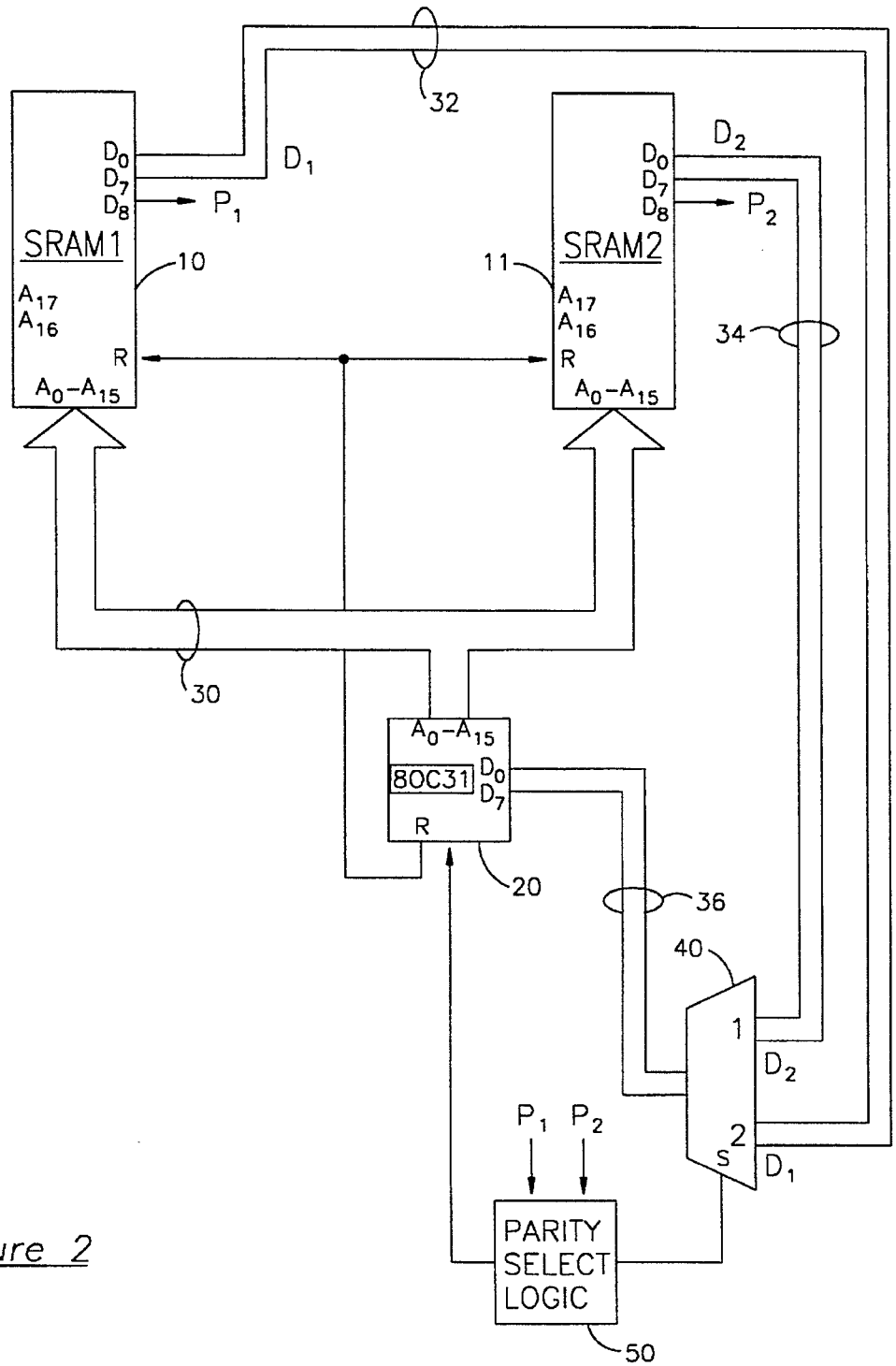
FIG. 2 shows a block diagram of a micro-controller coupled to the SRAM of FIG. 1.

Referring to FIG. 2, there is shown a block diagram of the micro controller 20 connected to the SRAM 1 10 and SRAM 2 11. The address lines 30 from the microcontroller 20 are coupled to both the SRAM 1 10 and SRAM 2 11. The data lines 32 from SRAM 1 10 are coupled to a multiplexer 40 and the data lines 34 from SRAM 2 11 are also coupled to the multiplexer 40. The output of the multiplexer 40 is coupled to the data terminals of the micro controller 20 via data lines 36. A control signal from the microcontroller 20 is coupled to SRAM 1 10 and SRAM 2 11 which includes the chip enable, read enable, write enable, . . . . The parity bit P1 from SRAM 1 10 and the parity bit P2 from SRAM 2 11 are coupled to a parity select logic 50.

When the microcontroller 20 desires to read from the SRAM, the address of the information desired is placed on the address lines 30 ($A_0$ through $A_{15}$ allows the microcontroller to read 64k bits of information from the SRAM). The information is read from the specified location of both the primary area of SRAM 2 11 and the backup area of SRAM 1 10 and the information is placed on the respective data lines 34, 32. The Parity bits P1, P2 are coupled to the parity select logic 50. If there is no error on either parity bit P1, P2, as indicated in the truth table for the parity select logic, the parity select logic outputs a signal which selects inputs 1 which is the data from the primary area of SRAM 2. This data is then coupled via data lines 36 to the microcontroller 20. If however an error is detected from a read of the primary area of SRAM 2, the parity select logic 50 outputs a control signal which selects the data from the backup area, i.e., the data on the second set of input ports of the multiplexer 40, which is then coupled to the microcontroller 20. If a parity error occurs on both the SRAM 1 and the SRAM 2, the select logic generates an interrupt to the micro controller for further processing. In the preferred embodiment, the parity select logic generates a reset signal to the microcontroller 20 which essentially stops the micro controller 20. Thus, if an error is detected from the primary data, the secondary (or backup) data can be read into the microcontroller 20 without any extension of time. The microcontroller of the preferred embodiment, requires the data to be on the data ports 361 nano seconds from the initiation of the read cycle (the rising edge of the ALE-address latch enable-pulse from the 80c31 microcontroller). Because the SRAM is shared with another processor and time is allocated to the other processor for accessing the SRAM in an arbitration scheme, the utilization of a traditional EDAC techniques which requires 60 additional nano seconds does not meet the requirement that the data be valid at the microcontroller data input ports within 361 nano seconds from the rising edge of the ALE pulse. The scheme of the present invention provides for the correct data to be valid at the processor within the required time frame. The sharing of the SRAM will be described herein under.

Figure 3:
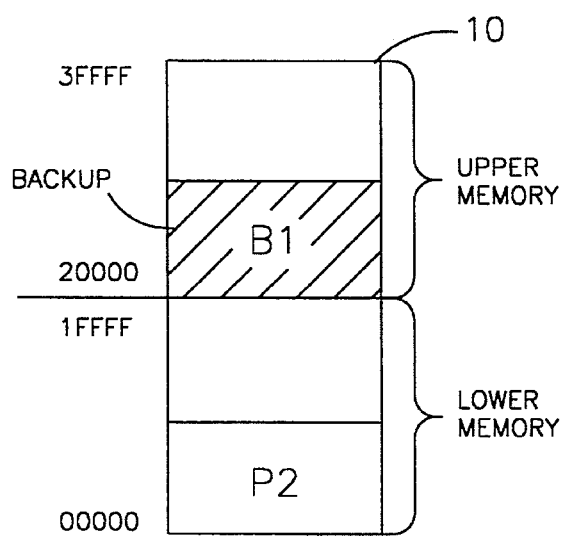
FIG. 3 shows a memory map of the SRAM showing a predetermined allocation of memory space of the SRAMs.
Figure 3:
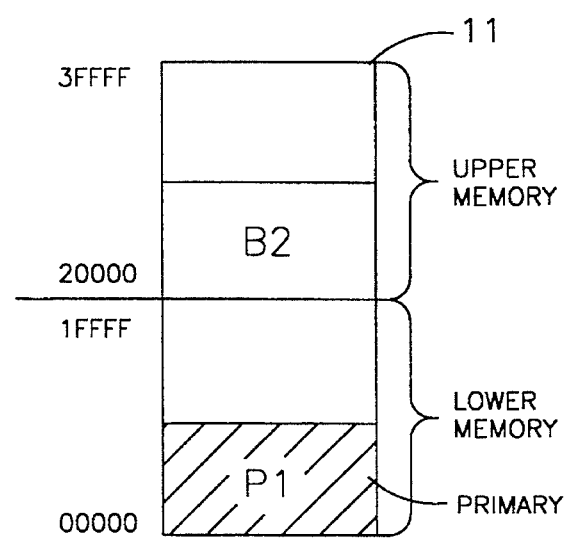

Referring to FIG. 3, there is shown a memory map of the memory unit of the microcontroller 20. The memory units of the preferred embodiment of the present invention include effectively 2 physical SRAMs each consisting of 128k×9 bytes. The primary information (data and instructions) for the microcontroller 20 is as shown starting at location zero (area P1, P2), and the backup information for the microcontroller 20 is starting at location 20000HEX (area B1, B2). (All memory locations utilized in the present application will be in HEXADECIMAL form.)

Figure 4:
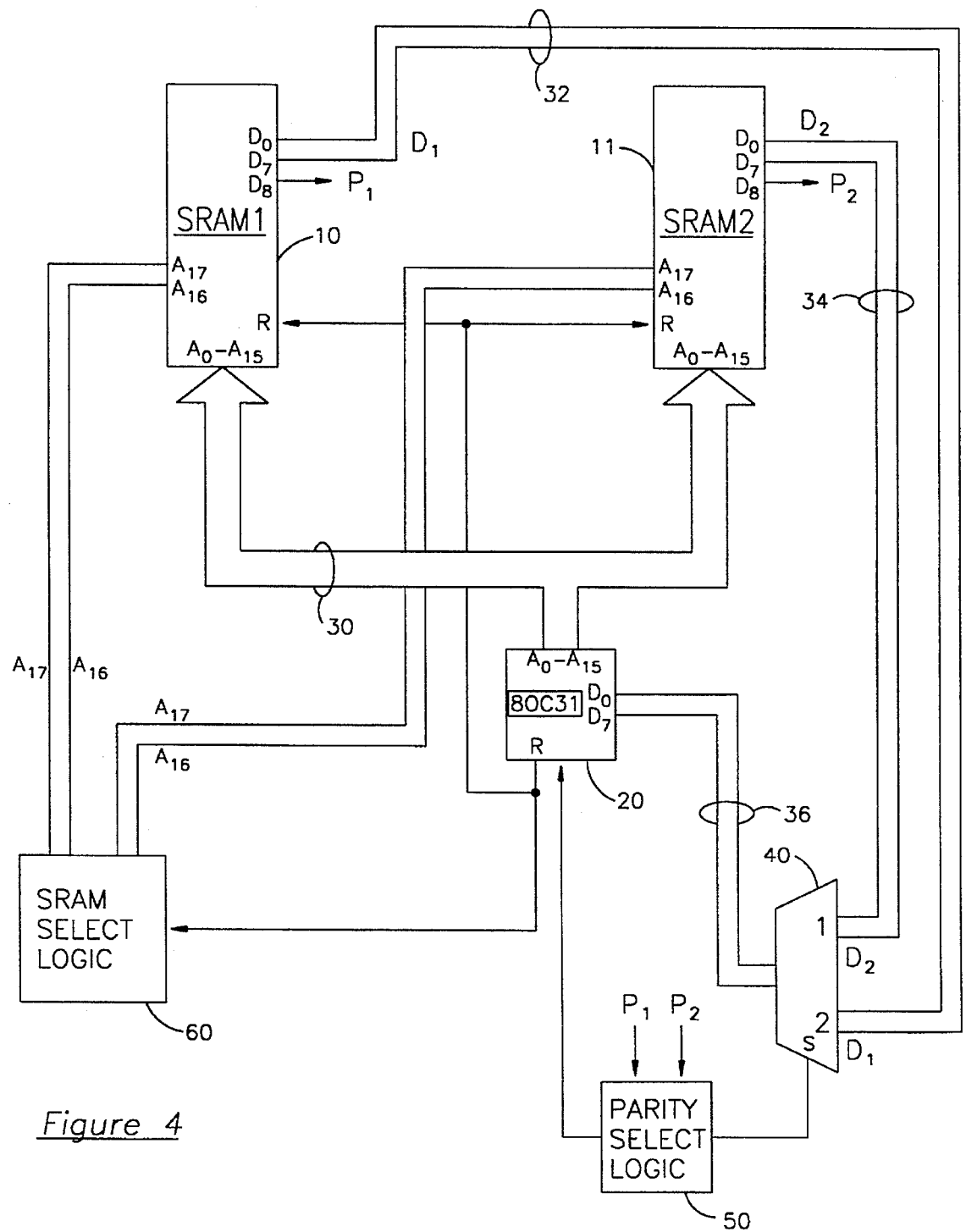
FIG. 4 shows a block diagram of a micro-controller coupled to the SRAMs of FIG. 3 having the predetermined allocation.

Referring to FIG. 4, there is shown the block diagram of the microcontrollers coupled to the memory unit (including SRAM 1 10 and SRAM 2 11). In addition, the SRAM select logic 60 is included for control of the A16, A17 bits of the respective SRAMS 10, 11 in order to address the upper or lower half of the SRAM. The control signal from the microcontroller 20 is also coupled to the SRAM select logic 60 to indicate that the memory access (i.e., read) is being performed by the microcontroller 20. In this case, the SRAM select logic is such that when the microcontroller 20 is accessing Byte P1 of the SRAMS, A17 and A16 bits coupled to SRAM 2 11 will both be zero, thereby addressing the low memory, i.e., the primary area P1. However, the A17 bit will be a logic 1 and the A16 bit will be a logic 0 coupled to SRAM 1 and thereby addressing the backup area B1. If microcontroller 20 is accessing byte P2 of the SRAMS, A17 and A16 bits coupled to SRAM2 11 will be at logic 1 and 0 respectively and A17 and A16 coupled to SRAM1 10 are both at logic 0. When the read is performed, the data is outputted on the data lines 32 from SRAM 1 and from data lines 34 from SRAM 2 and coupled to the multiplexer 40. The parity select logic 50 determines whether the data in the first and second memory contains the primary or the backup information and generates the control signal to select the set of input ports to be output from the multiplexer. The control signal selects the primary information to be coupled to the processor if no error is indicated in the primary copy and selects the backup information to be coupled to the processor if an error is indicated in the primary copy and not the backup copy.

The time restriction for the data availability for the microcontroller 20 comes about as a result of the memory being shared with another processor.

Figure 5:
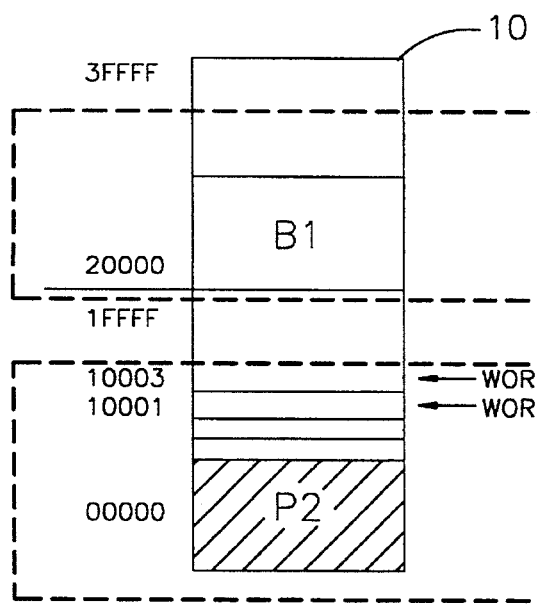
FIG. 5 shows a memory map of the SRAM allocation of the preferred embodiment of the present invention.
Figure 5:
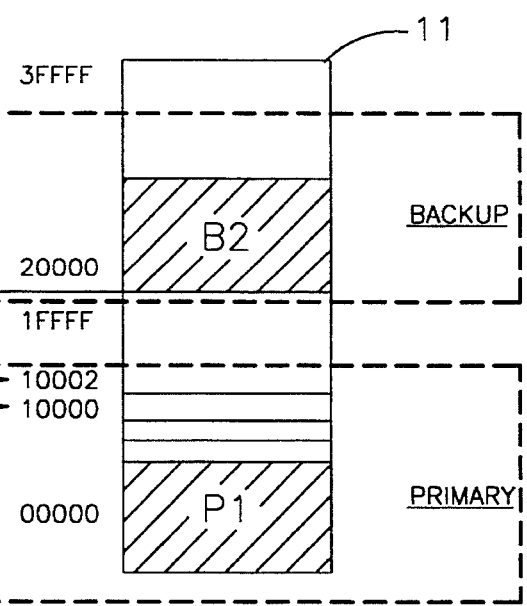

Referring to FIG. 5, there is shown a memory map of the memory allocation of the preferred embodiment of the present invention. SRAM 1 10 and SRAM2 11 are allocated such that for both the microcontroller and the second processor, the primary area is in the lower memory address space and the backup area is in the upper memory address space. The primary copy and the corresponding backup copy of a particular byte of data reside in physically different SRAMs. This enables simultaneous read and write operation into the Shared SRAM. For example, the Primary Copy at address 0 0000 referenced as P1 is in SRAM and the Backup Byte at address 2 0001 referenced as B1 is in SRAM1.

Figure 6:
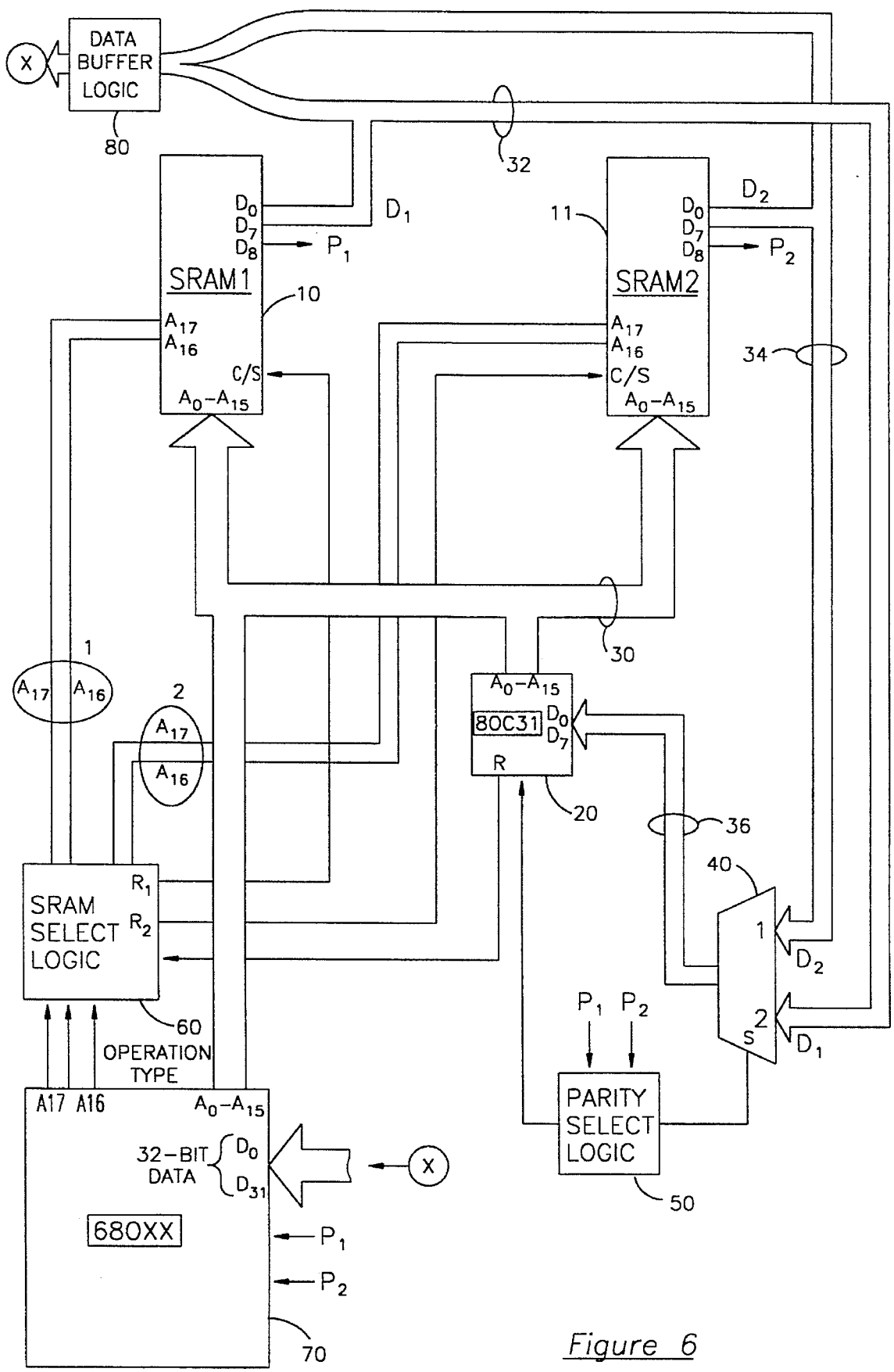
FIG. 6 shows a block diagram of the shared SRAMs between a first and second processor, the processors being of different types.

Referring to FIG. 6, there is shown a block diagram of the shared SRAM 10, 11 being available for access by a microcontroller 20 and a second processor 70. The second processor 70 of the preferred embodiment of the present invention is a Motorola 68000 family processor. The second processor 70 has the address lines coupled into the address bus 30 for addressing the SRAMs 10, 11. Bits A16 and A17 of the second processor 70 are coupled to the SRAM select logic 60 along with control information, which identifies the operation type, i.e., whether the read is a byte read, word read, or long word. As a result, the logic contained in the SRAM select logic 60 generates the address signals A17, A16 to SRAM 1 and the address signals A17, A16 to the SRAM 2 11 in accordance with the truth table shown in FIG. 7. The data buses from the respective SRAMS 32, 34 are coupled to a data buffer logic 80, the output of the data buffer logic 80 being a 32-bit output which is coupled to the data ports $D_0$-$D_{31}$ of the second processor 70. The parity bits are likewise coupled to the second processor 70. The second processor 70 has the processing power to identify whether a parity error exists and initiate a second read such that the backup area can be read. In cases where a word read is performed, the second processor 70 has the ability to read an entire 16 bit word which may incorporate the primary area P1 and the primary area P2. In this manner, the communication between the two processors is performed via the shared SRAM. If an error is detected in the data read, the second processor 70 can initiate a second read of the same data from the backup area, i.e., the respective B1 area and B2 area and then perform a byte swap in order for the bytes to be in the proper sequence. Because the 68XXX of the preferred embodiment of the present invention includes a data acknowledge signal, the time restriction applicable to the microcontroller 20 is not applicable to the second processor of the preferred embodiment.

The arbitration scheme for the preferred embodiment of the present invention includes a cycle in which the first half of the cycle is allocated to the second processor 70 and the second half of the cycle is allocated to the microcontroller 20. This arbitration scheme is needed when both the second controller 70 and the microcontroller 20 attempt to address the SRAM at essentially the same time. The request by the second processor to access the SRAM 10, 11 requires a synchronization of the "external request" and if the request is asserted within a predetermined time slot, the second processor 70 gains access into the SRAM. The remainder of the time is allocated for the microcontroller 20. For a long word read, the cycle is divided into two word read operations. If, for example the 68XXX performs a long word read from location 10000, the cycle is divided into 2 word cycles. Word 1 (address 10000 and 10001) are accessed in the first cycle, and word 2 (address 10002 and 10003) are accessed in the second cycle. The operation of the Motorola 68XXX is well documented and well known to those skilled in the art, including the operation of the data buffer logic 80.

Although the specified microcontroller and the second processor has been identified, it will be understood by those skilled in the art that any microprocessor, microcontroller, . . . may be utilized. The present invention can be utilized to address any time restrictions relative to accessing a shared SRAM. Likewise, the logic of the parity select logic 50 and the SRAM select logic 60 can be implemented by one skilled in the art from the truth table shown in the specification.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

I claim:

1. An apparatus for correcting errors in information read from a memory unit, comprising:

a) a first and second memory, each of said first memory and said second memory being divided into a lower memory and an upper memory such that the lower memory stores primary information and the upper memory stores backup information, the upper memory addressable locations of the first memory being corresponding relative addressable locations of the lower memory addressable locations of the second memory, the primary information and the backup information stored in a corresponding relative addressable location being the same;

b) a processor, operatively connected to said first and second memory, for commanding a read of information stored in said memory unit, the read being a simultaneous read of the primary information stored in the lower memory of the first and second memories and the corresponding backup information stored in the upper memory of the said first and second memories;

c) memory select logic, operatively connected to said first and second memories, for generating address information to cause the lower memory of the first memories to be read and to cause a corresponding relative addressable location of the upper memory of the second memory to be read, such that the primary information and the corresponding backup information are read;

d) a multiplexer, having a first set and a second set of input ports and further having a first set of output ports, the one set of output ports coupled to said first processor, and wherein the primary information read from the lower memory of the first and second memories and the backup information read from the upper memory of the first and second memories are coupled to the first and second input ports of the multiplexer, and e) select logic, operatively connected to said multiplexer, and further operatively connected to said first memory and to said second memory, the first and second memory indicating via the respective first and second error signal if an error is detected on the information just read from the first and second memory, respectively, the select logic determines whether the data in the first and second memory contains the primary or the backup information and generates a select signal to select the set of input ports containing the primary data when no error is indicated in the primary copy thereby selecting the primary information to be coupled to the first processor, and to select the other set of input ports containing the backup data when an error is indicated in the primary copy and no error is indicated in the backup copy thereby selecting the backup information to be coupled to the first processor, which is the correct information.

2. An apparatus according to claim 1, further wherein said select logic is operatively connected to said processor to indicate when an error is detected, on a read of information, from both the first memory and the second memory.

3. An apparatus for correcting errors in information accessed from a memory unit, comprising:

a) a first and second memory, each of said first memory and said second memory being a single byte-wide, and further being divided into a lower memory and an upper memory such that the lower memory of the first and second memories stores primary information and the upper memory of the first and second memories stores backup information, the upper memory addressable locations of the second memory being corresponding relative addressable locations of the lower memory addressable locations of the first memory, the primary information and the backup information stored in a corresponding relative addressable location being the same;

b) a first processor, operatively connected to said first and said second memories, for accessing information stored in said first and said second memories, the access being a simultaneous access of the primary information stored in the lower memory of the first and second memories and the corresponding backup information stored in upper memory of the first and second memories, the primary information and the backup information both being a single byte wide;

c) a second processor, operatively connected to said first and said second memories, for accessing information stored in said first and said second memories, the second processor being capable of performing a plurality of access operations types including byte read, word read, and long word read, the information accessed from the first and the second memories being operatively coupled to the said second processor, and further wherein a first and second error signal is operatively coupled to the second processor to indicate an accessing error of the first and the second memories, respectively;

d) memory select logic, operatively connected to said first and said second memories, for generating address information to cause the lower memory of the first memory to be accessed and to cause a corresponding relative addressable location of the upper memory of the second memory to be accessed, such that the primary information and the corresponding backup information are accessed when said first processor is accessing the first and the second memories, and to generate address information to the first and the second memories to cause the first and the second memories to be accessed in accordance with the type of access operation being commanded by the second processor.

4. An apparatus according to claim 3, further wherein said select logic is operatively connected to said first processor to indicate when an error is detected on an access of information from both the first memory and the second memory.

5. An apparatus according to claim 4, further comprising:

buffer logic, interposed between said first and the second memories and said second processor, to assemble the byte-wide data accessed from the first and the second memories into a data format consistent with the access operation type commanded.

* * * * *